United States Patent [19]

Nakamura et al.

[11] Patent Number: 5,200,630
[45] Date of Patent: Apr. 6, 1993

[54] SEMICONDUCTOR DEVICE

[75] Inventors: Noboru Nakamura, Hirakati; Hiroyuki Kuriyama, Minoo; Shinya Tsuda, Yahata; Shoichi Nakano, Hirakata, all of Japan

[73] Assignee: Sanyo Electric Co., Ltd., Osaka, Japan

[21] Appl. No.: 742,578

[22] Filed: Aug. 7, 1991

Related U.S. Application Data

[63] Continuation of Ser. No. 504,638, Apr. 3, 1990, abandoned.

[30] Foreign Application Priority Data

Apr. 13, 1989 [JP] Japan ............................. 1-93759
May 18, 1989 [JP] Japan ............................. 1-124903

[51] Int. Cl.$^5$ .................. H01L 45/00; H01L 27/01; H01L 27/13
[52] U.S. Cl. ............................ 257/570; 257/66; 257/288
[58] Field of Search .................... 357/2, 4, 23.7, 23.9

[56] References Cited

U.S. PATENT DOCUMENTS

| 4,348,746 | 9/1982 | Okabayashi et al. | 357/23.7 |
| 4,808,546 | 2/1989 | Moniwa et al. | 357/4 |
| 4,905,072 | 2/1990 | Komatsu et al. | 357/2 |
| 4,942,441 | 7/1990 | Konishi et al. | 357/4 |

FOREIGN PATENT DOCUMENTS 63-119576  5/1988  Japan ............................. 357/2

Primary Examiner—Andrew J. James
Assistant Examiner—Ngan Van Ngo
Attorney, Agent, or Firm—Darby & Darby

[57] ABSTRACT

A semiconductor device including a semiconducting layer made of polycrystalline silicon, an insulating film provided on an upper face of the semiconducting layer and an electrode provided on an upper face of the insulating film such that channels are formed on the upper face of the semiconducting layer, the improvement comprising: a further semiconducting layer made of amorphous silicon, which is provided between the semiconducting layer and the insulating film.

4 Claims, 2 Drawing Sheets

SEMICONDUCTOR DEVICE

This is a continuation of application Ser. No. 504,638, filed Apr. 3, 1990, now abandoned.

BACKGROUND OF THE INVENTION

The present invention relates to a semiconductor device suitably applicable to a thin film transistor (TFT), etc. for use in an image sensor or the like, in which mobility of carriers and yield are improved.

In a known image sensor in which a number of TFTs are arranged in a form of a matrix on a substrate, each of the TFTs is required to have excellent yield and high quality in order to improve quality of the image sensor.

FIG. 1 shows one example of such known TFT. The known TFT includes a substrate 31 made of glass or the like, a film 32 made of silicon nitride, a semiconducting layer 33 made of polycrystalline silicon, a source layer 34, a drain layer 35, a gate insulating film 36 made of silicon nitride, a source electrode 37, a drain electrode 38 and a gate electrode 39.

FIG. 2 shows schematically neighborhood of an interface between the semiconducting layer 33 and the gate insulating film 36 on a large scale. In this neighborhood, the gate insulating film 36 enters into recesses between adjacent crystal grain boundaries of polycrystalline silicon on an upper face of the semiconducting layer 33 so as to form insulating portions 40.

In the above known TFT, mobility of carriers is poor on the following ground. Namely, it is considered that since location of channels formed in the semiconducting layer 33 is restricted to an area disposed below the insulating portions 40, the semiconducting layer 33 cannot be used to full extent. Meanwhile, poor reproducibility and low yield of the known TFT will be attributed to the fact that since size and depth of crystal grain boundaries of polycrystalline silicon are nonuniform, size and depth of the insulating portions 40 formed between the crystal grain boundaries are also become nonuniform.

One example of such known TFT was introduced in a paper entitled "Poly-Si TFT fabricated by a low-temperature process utilizing XeCl excimer laser annealing" by Samejima et al. in a bulletin on lectures of the 46th meeting of the Japan Society of Applied Physics held in 1985.

SUMMARY OF THE INVENTION

Accordingly, an essential object of the present invention is to provide, with a view to eliminating the inconveniences inherent in conventional semiconductor devices, a semiconductor device in which a configuration of neighborhood of crystal grain boundaries of a semiconducting layer and an insulating film is improved such that not only mobility of carriers in channels but yield is raised.

In order to accomplish this object of the present invention, a semiconductor device according to the present invention includes a semiconducting layer made of polycrystalline silicon, an insulating film provided on an upper face of said semiconducting layer and an electrode provided on an upper face of said insulating film such that channels are formed on the upper face of said semiconducting layer, the improvement comprising: a further semiconducting layer made of amorphous silicon, which is provided between said semiconducting layer and said insulating film.

In order to improve mobility of carriers, the further semiconducting layer may have a thickness of 10–2,000 Å.

In the present invention, the further semiconducting layer made of amorphous silicon is provided between the semiconducting layer and the insulating film so as to enter into recesses between adjacent crystal grain boundaries of polycrystalline silicon on the upper face of the semiconducting layer. Therefore, in the present invention, insulating portions are not formed in the recesses in contrast with the known TFT referred to earlier.

Therefore, in accordance with the present invention, since channels for moving carriers therethrough are not retracted downwardly into the semiconducting layer, mobility of carriers can be improved.

In addition, in accordance with the present invention, even if shape of the recesses varies according to each production lot of the semiconductor devices, the insulating portions are not formed in the recesses by the insulating film. Accordingly, variations of shape of the recesses are not affected by the insulating portions and thus, yield in production of the semiconductor devices can be raised.

BRIEF DESCRIPTION OF THE DRAWINGS

This object and features of the present invention will become apparent from the following description taken in conjunction with the preferred embodiment thereof with reference to the accompanying drawings, in which.

DETAILED DESCRIPTION OF THE INVENTION

Figure 1:
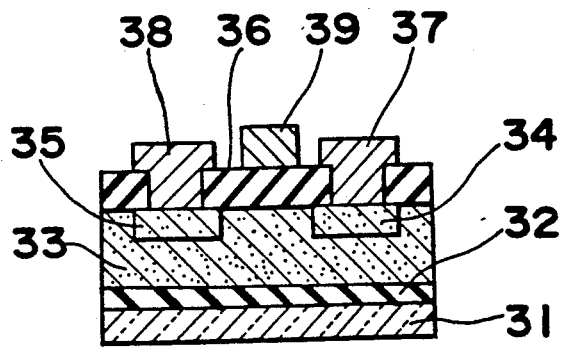
FIG. 1 is a sectional view of a prior art TFT (already referred to)
Figure 2:
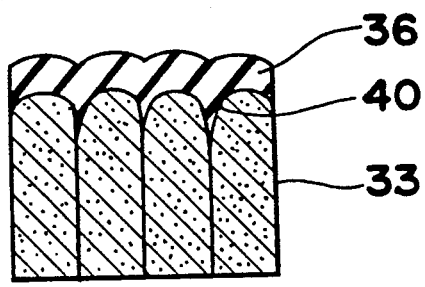
FIG. 2 is an enlarged fragmentary view of FIG. 1 (already referred to)
Figure 3:
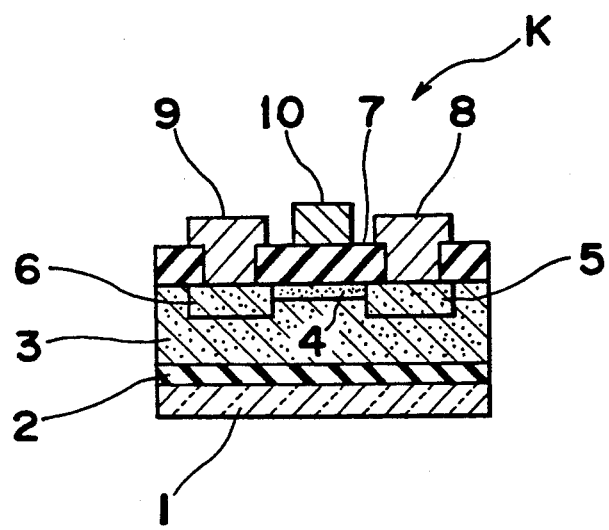
FIG. 3 is a sectional view of a TFT to which a semiconductor device according to one embodiment of the present invention is applied.

Referring now to the drawings, there is shown in FIG. 3, a TFT K to which a semiconductor device according to one embodiment of the present invention is applied. The TFT K includes a substrate 1 made of glass, an insulating film 2 made of silicon nitride, which is formed on the substrate 1, a first semiconducting layer 3 made of polycrystalline silicon, which is formed on the insulating film 2 and a second semiconducting layer 4 made of amorphous silicon. The TFT K further includes a source region 5 and a drain region 6 which are obtained by implanting into the first semiconducting layer 3 phosphorus acting as an impurity. Furthermore, the TFT K includes a gate insulating film 7 made of silicon nitride, a source electrode 8, a drain electrode 9 and a gate electrode 10 formed on the gate insulating film 7. As shown in FIG. 3, the gate insulating film 7 is provided on an upper face of the first semiconducting layer 3 and the gate electrode 10 is provided on an upper face of the gate insulating film 7 such that channels are formed on the upper face of the first semiconducting layer 3. Meanwhile, the second semiconducting layer 4 is provided between the first semiconducting layer 3 and the gate insulating film 7. It is needless to say that since such a positional indication as "upper" referred to above relates to only the illustration in FIG. 3, the TFT K can be used in an arbitrary orientation, for example, in an overturned orientation from the state of FIG. 3.

Figure 4:
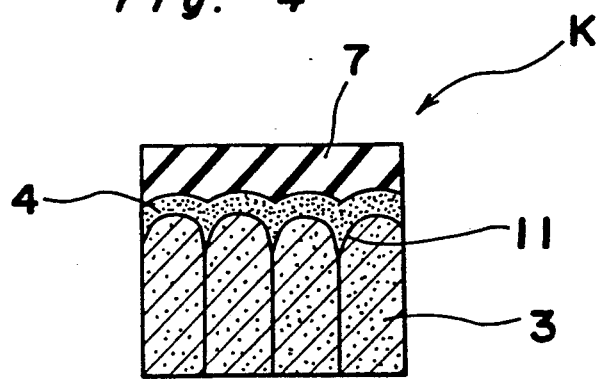
FIG. 4 is an enlarged fragmentary view of FIG. 3.

FIG. 4 shows neighborhood of interfaces among the first semiconducting layer 3, the second semiconducting layer 4 and the gate insulating film 7. As will be seen from FIG. 4, the second semiconducting layer 4 is filled into recesses 11 between adjacent crystal grain boundaries of polycrystalline silicon of the first semiconducting layer 3.

Hereinbelow, one example of a method of producing the TFT K is described. Initially, the insulating film 2 made of silicon nitride is formed in a thickness of 500–700 Å on the substrate 1 by glow discharge. Subsequently, amorphous silicon is formed in a thickness of 1,000–2,000 Å on the insulating film 2 by glow discharge and then, is crystallized by an XeCl excimer laser into the first semiconducting layer 3 made of polycrystalline silicon. Thereafter, amorphous silicon is formed in a thickness of 10–4,000 Å on the first semiconducting layer 3 by glow discharge and is etched as necessary into the second semiconducting layer 4 such that the second semiconducting layer 4 has a thickness of not more than 2,000 Å immediately below the gate insulating film 7.

Subsequently, phosphorus is implanted into predetermined areas of the first semiconducting layer 3 by ion implantation so as to form the source region 5 and the drain region 6. Furthermore, in order to form the gate insulating film 7, silicon nitride of a thickness of 500–1,500 Å is provided on the second semiconducting layer 4 and portions of the gate insulating film 7, which confront the source region 5 and the drain region 6, are removed. Thereafter, the source electrode 8 and the drain electrode 9, which are made of aluminum (Al), are formed on the source region 5 and the drain region 6, respectively. Then, the gate electrode made of molybdenum (Mo) is formed on the gate insulating film 7.

Table 1 below shows conditions for forming the insulating film 2, the gate insulating film 7 and the second semiconducting layer 4 which are, respectively, indicated by members 2, 7 and 4 in Table 1. In Table 1, the unit "sccm" of gas flow rate stands for standard cubic centimeter per minute.

TABLE 1

| Cond. Mem. 2, 7 & 4 | Substrate Temp. (°C.) | Pressure (Torr) | RF power (mw/cm$^2$) | Gas flow rate (sccm) |
|---|---|---|---|---|
| Mem. 2 & 7 | 200–300 | 0.2–0.5 | 10–100 | SiH$_4$: 10–50 NH$_3$: 10–200 |
| Mem. 4 | 200–300 | 0.2–0.5 | 10–50 | SiH$_4$: 10–50 |

Figure 5:
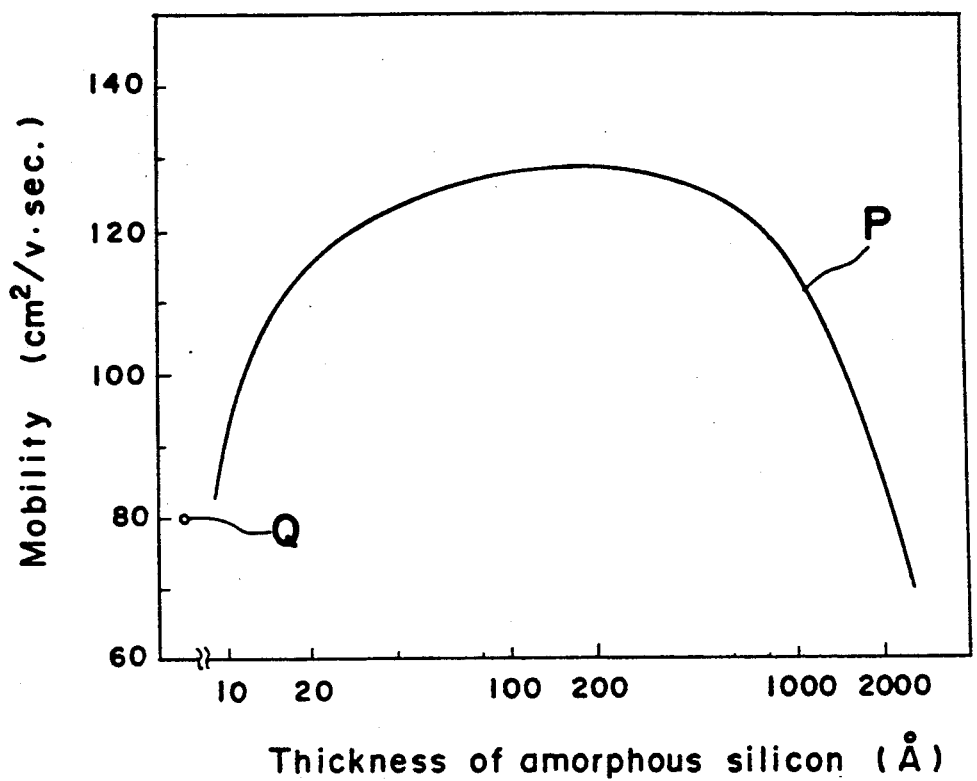
FIG. 5 is a graph showing a characteristic curve of the TFT of FIG. 3.

FIG. 5 shows change of mobility of carriers in the TFT K of the arrangement shown in FIG. 3 when thickness of the second semiconducting layer 4 made of amorphous silicon is changed. As is seen from the curve P in FIG. 5, mobility of carriers is increased upon increase of thickness of the second semiconducting layer 4 made of amorphous silicon and then, exhibits trend of reduction. However, when the second semiconducting layer 4 has a thickness of 10–2,000 Å, mobility of carriers exceeds that (point Q) of a conventional TFT. Especially, when the second semiconducting layer 4 has a thickness of 30–800 Å, mobility of carriers as high as not less than 120 cm$^2$/v.sec. is obtained. Yield of the conventional TFT was about 40%. However, in the TFT K of the present invention, yield exceeds about 80% and reaches more than 95% when the second semiconducting layer 4 has a thickness of not less than 100 Å.

Meanwhile, even after amorphous silicon formed on the first semiconducting layer 3 has been etched to the predetermined thickness so as to obtain the second semiconducting layer 4, mobility of carriers and yield are respectively about 110 cm$^2$/v.sec. and about 70%, which are superior to those of the conventional TFT.

In the above embodiment, the gate insulating film 7 is made of silicon nitride but may also be made of silicon oxide or the like. Furthermore, the present invention is not limited in application to the TFT but can also be applied to various fields such as a solar cell.

As will be seen from the foregoing description, in the semiconductor device of the present invention, the second semiconducting layer is provided between the first semiconducting layer and the gate insulating film disposed immediately below the gate electrode. Therefore, in accordance with the present invention, since the gate insulating film does not enter into recesses between crystal grain boundaries of polycrystalline silicon of the first semiconducting layer, insulating portions produced in the conventional TFT are not formed in the recesses. Accordingly, in the case where a TFT is produced by using the semiconductor device of the present invention, channels can be formed immediately below the gate insulating film, so that mobility of carriers and yield can be improved as described above.

Figure 6:
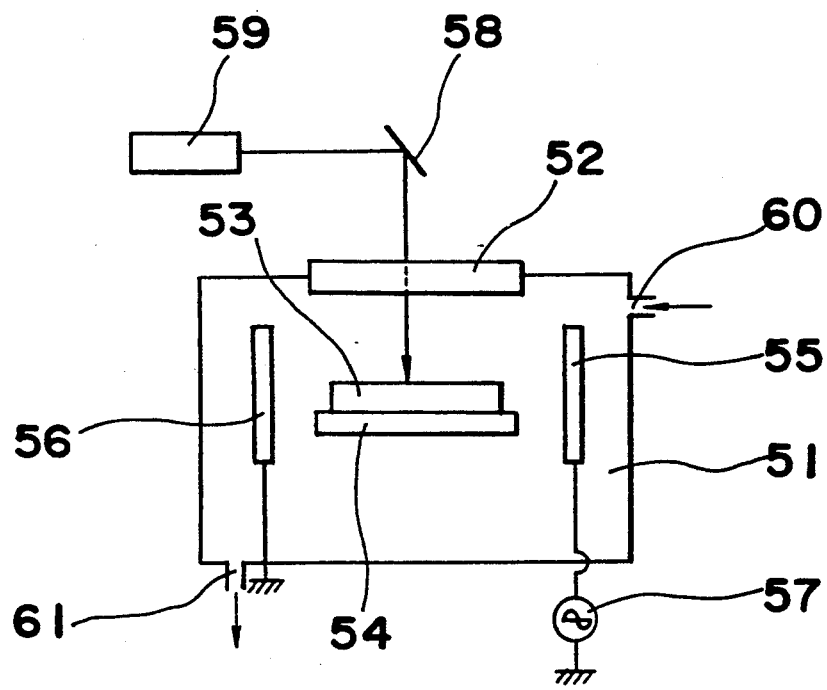
FIG. 6 is a schematic view of an apparatus for producing polycrystalline silicon used for fabricating the TFT of FIG. 3.

Meanwhile, the first semiconducting layer 3 is made of polycrystalline silicon as described earlier. Hereinbelow, a method of producing polycrystalline silicon having large mobility of carriers is described with reference to FIG. 6 showing an apparatus for producing polycrystalline silicon. As shown in FIG. 6, the apparatus includes a chamber 51 having a window 52. The window 52 has light transmission properties so as to transmit laser beams therethrough. A support base 54 for placing amorphous silicon 53 thereon is provided below the window 52. A pair of electrodes 55 and 56 confront each other so as to interpose the support base 54 therebetween. The apparatus further includes a power source 57 for supplying radio frequency power to the electrodes 55 and 56. A reflecting mirror 58 is provided above the window 52. A XeCl excimer laser 59 is provided on a left side of the reflecting mirror 58. The chamber 51 is provided with an inlet 60 for introducing hydrogen into the chamber 51 and a discharge opening 61 for discharging hydrogen out of the chamber 51.

In the apparatus of the above described arrangement, the amorphous silicon 53 to be crystallized is placed on the support base 54 in the chamber 51 and then, vacuum is drawn in the chamber 51. Subsequently, hydrogen gas is introduced into the chamber 51 from the inlet 60. Thereafter, hydrogen plasma is generated between the electrodes 55 and 56 and laser beams having a wavelength of 308 nm are irradiated onto the amorphous silicon 53 through the window 52 by the XeCl excimer laser 59 such that the amorphous silicon 53 is crystallized into polycrystalline silicon. Typical conditions for generating hydrogen plasma are a hydrogen flow rate of 20–200 sccm, a pressure of 0.1–1 Torr and a radio frequency power of 10–100 mw/cm$^2$, while strength of the XeCl excimer laser 59 is 150–300 mJ/cm$^2$.

Table 2 below shows mobility of carriers of polycrystalline silicon produced by the methods (1) and (2) of the present invention in comparison with that of polycrystalline silicon produced by a prior art method (3) and that of a prior art method (4) in which polycrystalline silicon obtained by the prior art method (3) has been subjected to treatment of hydrogen plasma. In the methods (1) and (2) of the present invention, laser annealing is performed in hydrogen and hydrogen plasma, respectively. It is to be noted that mobility of carriers of polycrystalline silicon is measured by field-effect technique.

TABLE 2

| Laser annealing | | Mobility ($cm^2/v \cdot sec.$) |
|---|---|---|
| (1) | Present invention (In hydrogen) | 150 |
| (2) | Present invention (In hydrogen plasma) | 210 |
| (3) | Prior art (Untreated) | 90 |
| (4) | Prior art (Hydrogen plasma treatment) | 110 |

Table 2 reveals that mobility of carriers in polycrystalline silicon produced by the method of the present invention is about 1.5 to 2 times that of the prior art method.

As is clear from Table 2 above, amorphous silicon is subjected to laser annealing in atmosphere containing hydrogen in the production method of the present invention. Therefore, in accordance with the present invention, since dangling bonds are compensated for by hydrogen, mobility of carriers in polycrystalline silicon is improved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A semiconductor device comprising:
   a semiconducting layer of polycrystalline silicon having a grain boundary,
   an insulating film provided on an upper face of said semiconducting layer,
   an electrode provided on an upper face of said insulating film,
   channels formed on the upper face of said semiconducting layer, and
   a further semiconducting layer of amorphous silicon located immediately between said insulating film and said upper face of said semiconducting layer, said further semiconducting layer having one face that faces the electrode, said face being in contact with said insulating film and beneath said electrode, said further semiconducting layer having an opposite face in contact with said upper face of said semiconducting layer of polycrystalline silicon and having a thickness of at most 2000 Å which prevents the insulating film from penetrating into the grain boundary of the polycrystalline silicon and which enables mobility of carriers in the channels.

2. A semiconductor device comprising:
   a semiconducting layer of polycrystalline silicon having a grain boundary,
   an insulating film provided on an upper face of said semiconducting layer,
   an electrode provided on an upper face of said insulating film,
   channels formed on the upper face of said semiconducting layer, and
   a further semiconducting layer of amorphous silicon located immediately between said insulating film and upper face of said semiconducting layer, said further semiconducting layer having one face that faces the electrode, said face in contact with said insulating film and beneath said electrode, said further semiconducting layer having an opposite face being in contact with said upper face of said semiconducting layer of polycrystalline silicon and having a thickness within a range of 10–2000 Å which prevents the insulating film from penetrating into the grain boundary of the polycrystalline silicon and which enables mobility of carriers in the channels.

3. A semiconductor device as in claim 1, wherein said electrode is a gate electrode made of molybdenum.

4. A semiconductor device as in claim 1, wherein each of said faces of said further semiconducting layer extends further in the same direction than does a lower face of said electrode that is on the upper face of the insulating film, all of said lower face facing said further semiconducting layer.

* * * * *